United States Patent
Nakamoto

(10) Patent No.: US 12,330,992 B2
(45) Date of Patent: Jun. 17, 2025

(54) MIXED MEMBER OF SiC AND Si AND PRODUCTION METHOD

(71) Applicant: FERROTEC MATERIAL TECHNOLOGIES CORPORATION, Tokyo (JP)

(72) Inventor: Mayumi Nakamoto, Tamano (JP)

(73) Assignee: FUKAMI PATENT OFFICE, P.C., Osaka (JP)

( * ) Notice: Subject to any disclaimer, the term of this patent is extended or adjusted under 35 U.S.C. 154(b) by 913 days.

(21) Appl. No.: 17/601,877

(22) PCT Filed: Dec. 17, 2020

(86) PCT No.: PCT/JP2020/047111
§ 371 (c)(1),
(2) Date: Oct. 6, 2021

(87) PCT Pub. No.: WO2021/132003
PCT Pub. Date: Jul. 1, 2021

(65) Prior Publication Data
US 2022/0194860 A1   Jun. 23, 2022

(30) Foreign Application Priority Data
Dec. 23, 2019   (JP) .................. 2019-231317

(51) Int. Cl.
  C04B 35/653   (2006.01)
  C04B 35/565   (2006.01)
  C30B 29/36    (2006.01)

(52) U.S. Cl.
  CPC .......... C04B 35/565 (2013.01); C04B 35/653 (2013.01); *C04B 2235/428* (2013.01); *C30B 29/36* (2013.01)

(58) Field of Classification Search
  CPC ............... C04B 35/565; C04B 35/653; C04B 2235/428; C30B 29/36; C01B 32/956; C01B 33/02
  USPC ..................................................... 264/129
  See application file for complete search history.

(56) References Cited

U.S. PATENT DOCUMENTS

| | | | |
|---|---|---|---|
| 4,795,673 A | 1/1989 | Frechette et al. | |
| 6,117,573 A | 9/2000 | Nishioka et al. | |
| 2014/0272378 A1 | 9/2014 | Jindo et al. | |
| 2018/0282227 A1* | 10/2018 | Ishida | C04B 41/5096 |

FOREIGN PATENT DOCUMENTS

| | | |
|---|---|---|
| CN | 102211769 A | 10/2011 |
| CN | 102382999 A | 3/2012 |
| CN | 102442826 A | 5/2012 |
| CN | 104045347 A | 9/2014 |
| CN | 105948822 A | 9/2016 |
| EP | 0 464 447 A1 | 1/1992 |
| JP | S57-047772 A | 3/1982 |
| JP | S62-270702 A | 11/1987 |
| JP | S63-011589 A | 1/1988 |
| JP | S63-223104 A | 9/1988 |
| JP | H04-045205 A | 2/1992 |
| JP | H04-65376 A | 3/1992 |
| JP | H05-017227 A | 1/1993 |
| JP | H08-325033 A | 12/1996 |
| JP | H10-45476 A | 2/1998 |
| JP | H11-131236 A | 5/1999 |
| JP | 2011-073906 A | 4/2011 |
| JP | 2013-245373 A | 12/2013 |
| JP | 2015-187076 A | 10/2015 |
| JP | 2018-168047 A | 11/2018 |
| JP | 2019-157204 A | 9/2019 |

OTHER PUBLICATIONS

English Translation of JPH 05-017227 (Year: 1993).*
Feb. 22, 2021 International Search Report issued in International Patent Application No. PCT/JP2020/047111.
Apr. 2, 2020 Office Action issued in Japanese Patent Application No. 2019-231317.
Jun. 24, 2022 Office Action issued in Chinese Patent Application No. 202080036143.1.

* cited by examiner

Primary Examiner — Hannah J Pak
(74) Attorney, Agent, or Firm — Oliff PLC

(57) ABSTRACT

A mixed member of SiC and Si, the mixed member being formable without using a resin as a medium irrespective of its shape. To achieve the object, a feature of the mixed member of SiC and Si (SiC/Si mixed member) lies in that a SiC member (filler) in a chip form or powdery form is dispersed in a Si member (base material) having a polycrystalline structure. Further, the SiC/Si mixed member with such a feature can be configured such that a SiC coating layer is formed on a surface of the SiC/Si mixed member.

3 Claims, 3 Drawing Sheets

MIXED MEMBER OF SiC AND Si AND PRODUCTION METHOD

TECHNICAL FIELD

The present invention relates to a mixed member, and particularly relates to a mixed member using SiC (silicon carbide) and Si (silicon) as source materials, and a method of producing the mixed member.

BACKGROUND ART

Since SiC (silicon carbide) has a wide band gap, a high thermal conductivity, a high dielectric breakdown voltage, and the like, there has been a high demand for SiC (silicon carbide) as a semiconductor material. SiC cannot be reformed by melting (but can be sublimated at a high temperature and can be recrystallized), so that many products having failed to have desired quality in a production process have to be discarded.

Since crystallized SiC cannot be melted at a high temperature, the crystallized SiC may be pulverized and used as powder. A technique disclosed in PTL 1 is to form a SiC/Si composite material in the following manner: SiC powder is mixed with a thermosetting resin, pressing is performed thereto under application of heat to form a porous member, and the porous member is impregnated with Si (silicon).

The SiC/Si composite material thus formed has a lighter weight, a higher specific rigidity, and a smaller thermal expansion coefficient than those of a metal material, thus resulting in an increased demand as a structural material in industrial fields and the like.

CITATION LIST

Patent Literature

PTL 1: Japanese Patent Laying-Open No. 2011-73906

SUMMARY OF INVENTION

Technical Problem

According to the technique disclosed in PTL 1, a SiC member to be discarded may be reusable. However, in the technique disclosed in PTL 1, the porous resin is formed using the resin as a medium, and is impregnated with Si. Therefore, it is concerned that the heat resistance in the technique disclosed in PTL 1 is lower than that of SiC or Si and deterioration occurs over time. Further, since the impregnation with Si is employed, it is difficult to form a thick solid material.

In view of the above, it is an object of the present invention to provide: a mixed member of SiC and Si, the mixed member being formable without using a resin as a medium irrespective of its shape; and a method of producing the mixed member of SiC and Si.

Solution to Problem

To achieve the above object, a feature of a mixed member of SiC and Si according to the present invention lies in that a SiC member in a chip form or powdery form is dispersed in a Si member having a polycrystalline structure.

Further, the mixed member of SiC and Si with the above feature may be configured such that a SiC layer is formed on a surface of the mixed member of SiC and Si. With such a feature, the density of the surface of the mixed member can be increased.

To achieve the above object, a feature of a method of producing a mixed member of SiC and Si according to the present invention lies in that the method includes: a preparation step of preparing a Si member in a chip form or powdery form and a SiC member in a chip form or powdery form; a heating step of heating a mixed material of the Si member and the SiC member to a melting temperature of the Si member; and a cooling step of recrystallizing the melted Si member with the SiC member being included in the melted Si member.

Further, the method of producing the mixed member of SiC and Si with the above feature may further include a stirring step of placing, in a predetermined container, only the Si member and the SiC member prepared in the preparation step and mixing the Si member and the SiC member each in a solid state in the predetermined container. With such a feature, a degree of mixing (degree of dispersion) of SiC with Si becomes excellent.

Further, in the method of producing the mixed member of SiC and Si with the above feature, in the heating step, the SiC member may be dispersed in the Si member using convection of the Si member. With such a feature, SiC can be dispersed in Si even when the stirring step is omitted.

Further, the method of producing the mixed member of SiC and Si with the above feature may include a surface treatment step of forming a SiC coating layer on a surface of the mixed member of SiC and Si after the cooling step. With such a feature, the density of the surface of the formed mixed member of SiC and Si can be increased.

Advantageous Effects of Invention

According to the mixed member of SiC and Si and its production method with the above feature, the mixed member is formable without using a resin as a medium irrespective of its shape.

DESCRIPTION OF EMBODIMENTS

Hereinafter, an embodiment of a mixed member of SiC and Si according to the present invention will be described in detail with reference to figures. It should be noted that the embodiment described below is a part of a preferred embodiment for carrying out the present invention, and can be regarded as a part of the present invention even when a portion of the configuration thereof is changed as long as the effect thereof is achieved.

SiC/Si Mixed Material

Figure 1:
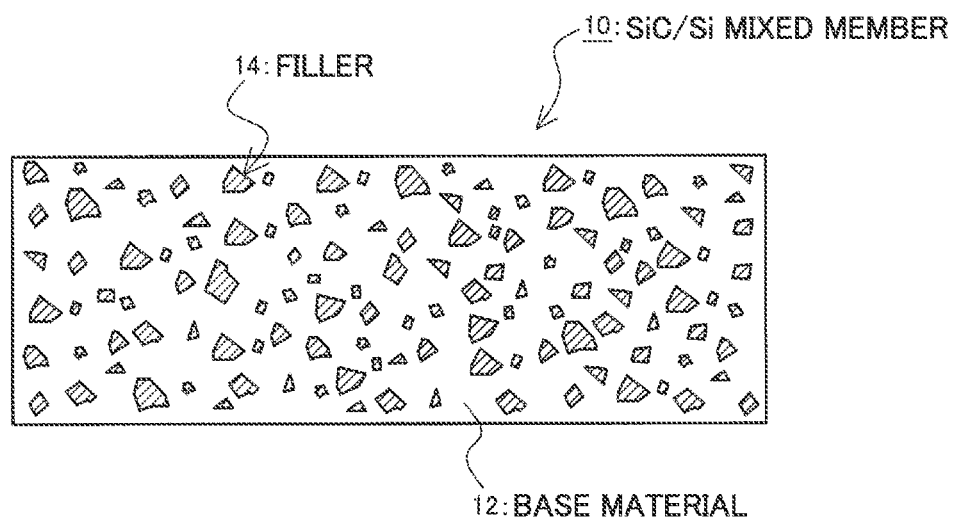
FIG. 1 is a schematic diagram showing a configuration of a mixed member of SiC and Si according to an embodiment.

First, referring to FIG. 1, a configuration of a mixed member of SiC and Si (hereinafter, referred to as "SiC/Si mixed member 10") according to the present embodiment will be described. It should be noted that FIG. 1 shows that SiC/Si mixed member 10 has a quadrangular shape (cubic shape); however, the external shape of SiC/Si mixed member 10 is not limited thereto.

SiC/Si mixed member 10 according to the present embodiment is a mixed member in which Si is used for a base material 12 and SiC is used for filler 14. SiC/Si mixed member 10 having the shape shown in FIG. 1 is formed by dispersing chip-form SiC pieces in polycrystallized Si. A distribution density of SiC serving as filler 14 is not limited, and can be changed in accordance with desired characteristics for SiC/Si mixed member 10.

For example, when the density of SiC is dense, a member is formed to have characteristics such as improved hardness, improved thermal conductivity, improved oxidation resistance, improved chemical resistance, improved plasma etching resistance, and reduced fracture toughness (cleavability=a degree of easiness of cracking) of Si. On the other hand, when the density of SiC is sparse, a member is formed to have characteristics such as improved workability and reduced weight as compared with a product of SiC.

Effect

Thus, the characteristics of SiC/Si mixed member 10 according to the present embodiment can be appropriately adjusted in accordance with a mixing ratio of base material 12 and filler 14. Further, since only Si and SiC are used as the constituent members, heat resistance can be increased as compared with the conventional technique in which a resin is used as a medium for the shaping for SiC.

Figure 2:
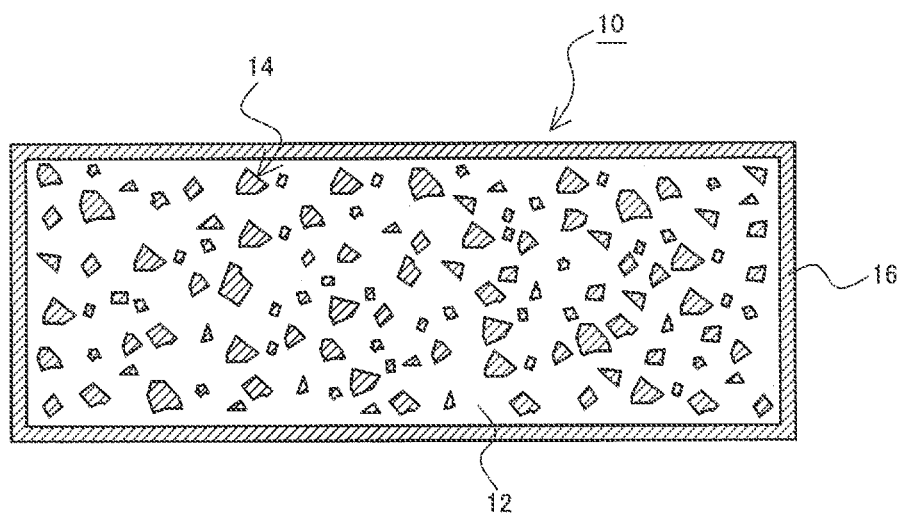
FIG. 2 is a schematic diagram showing an example in which a SiC coating layer is provided on a surface of the mixed member of SiC and Si according to the embodiment.

In SiC/Si mixed member 10 having such a configuration, a SiC coating layer 16 may be provided on a surface of SiC/Si mixed member 10 as shown in FIG. 2. With such a configuration, the density of the surface can be increased.

Modification

In the above embodiment, it is described that SiC dispersed as filler 14 in Si serving as base material 12 is in the chip form. However, SiC may be in a powdery form. When SiC to be dispersed is in the powdery form (particles), each SiC particle is fine in volume. Thus, an influence of stress caused by a difference in thermal expansion coefficient from that in Si serving as the base material can be made small.

Further, when SiC serving as filler 14 is in the powdery form, the mixing ratio of SiC can be made very large.

First Production Method

Figure 3:
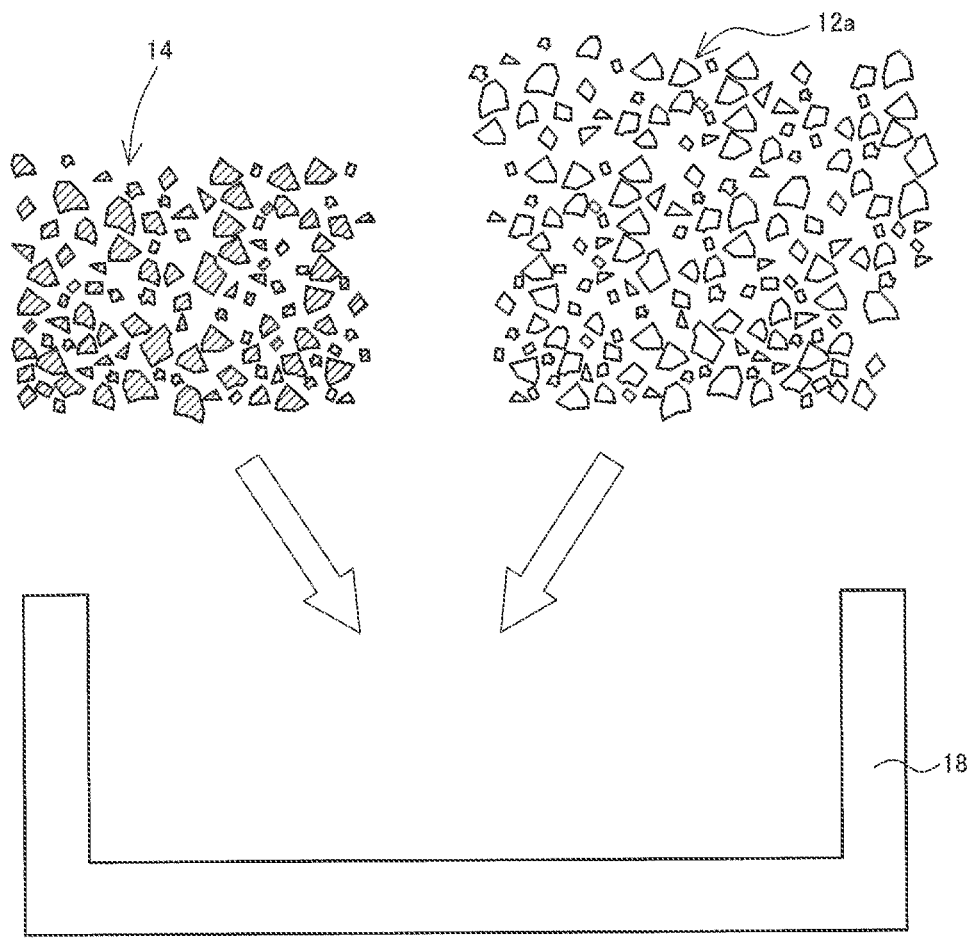
FIG. 3 is a diagram for illustrating a preparation step in a method of producing the mixed member of SiC and Si according to the embodiment.

Next, a first production method for the SiC/Si mixed member according to the embodiment will be described with reference to FIGS. 3 to 6. First, as shown in FIG. 3, Si in the chip form (chip-form base material 12a) and SiC in the chip form (filler 14) are prepared and are placed in a container 18. Here, container 18 is constituted of a member that has a heat resistance for a temperature of more than or equal to the melting point (1414° C.) of Si serving as chip-form base material 12a and that does not cause deformation or change in characteristics. Examples thereof may include quartz (softening point of about 1600° C. to 1700° C.), graphite, sintered SiC, CVD-SiC, and the like.

Figure 4:
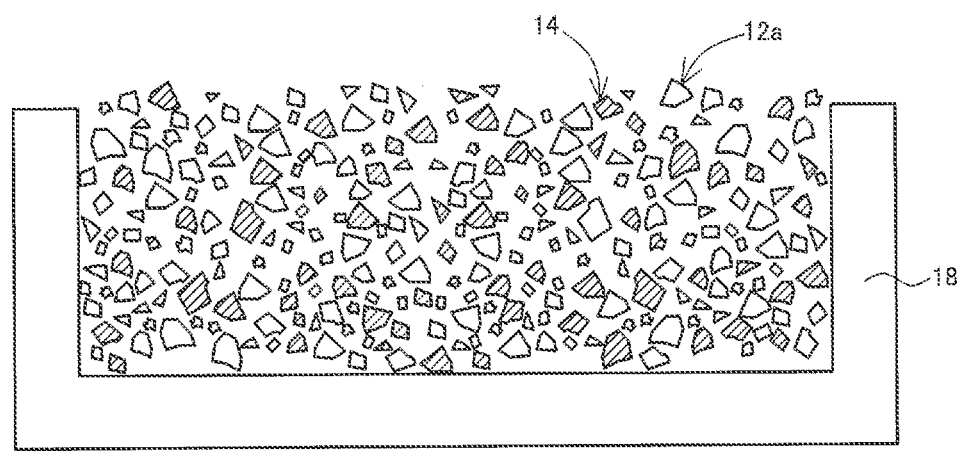
FIG. 4 is a diagram for illustrating a stirring step in the preparation step of the method of producing the mixed member of SiC and Si according to the embodiment.
Figure 5:
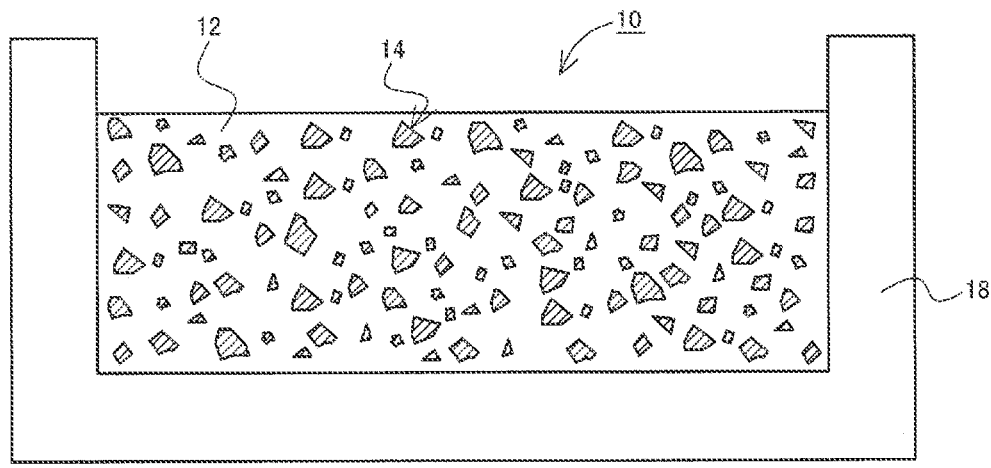
FIG. 5 is a diagram for illustrating a heating step in the method of producing the mixed member of SiC and Si according to the embodiment.

Next, as shown in FIG. 4, chip-form base material 12a and filler 14 placed in container 18 are mixed with each other. By mixing chip-form base material 12a and filler 14 each in a solid state, a degree of mixing of base material 12 and filler 14 (a degree of dispersion of filler 14) will be excellent when chip-form base material 12a is melted (the preparation step and the stirring step).

Next, chip-form base material 12a and filler 14 placed in container 18 are heated. It should be noted that heating is desirably performed in an inert atmosphere. A heating temperature is set to a temperature that is more than or equal to the melting point (1414° C.) of Si serving as chip-form base material 12a and that is less than the softening point of container 18 (for example, 1600° C. to 1700° C. when container 18 is composed of quartz) and less than the sublimation point (for example, more than or equal to 2000° C.) of SiC serving as filler 14. When chip-form base material 12a is melted, vibration may be applied using a vibration application apparatus, an ultrasonic apparatus, or the like (each not shown) to perform degassing treatment (heating step: see FIG. 5).

After melting chip-form base material 12a and dispersing filler 14 in base material 12, base material 12 in the molten state is cooled to be recrystallized (solidified). A temperature decrease rate during the cooling may differ depending on the shape, heat capacity, or the like of SiC/Si mixed member 10, and is not indiscriminately determined; however, the temperature decrease rate may be set to a temperature decrease rate recognized as being appropriate for a region having the largest cross sectional area and a large heat capacity in a desired shape. This is due to the following reason: when the temperature decrease rate is set based on a region having a small heat capacity, a temperature difference becomes large between internal and external portions of the region having a large heat capacity, thus leading to generation of a crack or the like. It should be noted that the recrystallized Si (base material 12) has a polycrystalline structure (cooling step).

Figure 6:
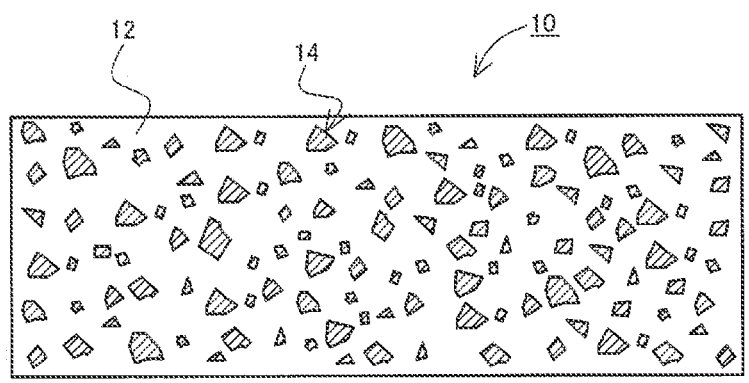
FIG. 6 is a diagram showing a state in which a container is removed after end of a cooling step in the method of producing the mixed member of SiC and Si according to the embodiment.

After the end of the cooling step, container 18 is removed, thereby completing SiC/Si mixed member 10 (see FIG. 6). Here, SiC/Si mixed member 10 may be subjected to surface treatment such as cutting, polishing, or coating as required.

Effect

Since SiC/Si mixed member 10 produced through such steps can be formed without using a resin as a medium, SiC/Si mixed member 10 can have excellent heat resistance. Further, since Si serving as base material 12 is melted and is mixed with Si serving as filler 14, filler 14 can be dispersed in base material 12 irrespective of the shape of SiC/Si mixed member 10.

Second Production Method

It has been described that in the first production method, the preparation step includes the stirring step of mixing chip-form base material 12a and filler 14 in container 18.

However, the stirring step is not necessarily required as long as filler 14 can be dispersed in base material 12. For example, in the heating step, convection occurs in melted base material 12 (liquid Si). When filler 14 can be dispersed in base material 12 by this convection, the stirring step can be omitted. It is considered that the dispersion of filler 14 by the convection is effective when filler 14 is in the powdery form.

INDUSTRIAL APPLICABILITY

In the above-described embodiment, it has been described that in the formation of SiC/Si mixed member 10, filler 14 is evenly mixed with base material 12. However, a distribution ratio of filler 14 may be intentionally biased. For example, for a member (etcher ring or the like) required to have etching resistance, SiC serving as filler 14 may be concentrated on a side surface to be etched or on a specific region, thereby improving the characteristic.

REFERENCE SIGNS LIST

10: SiC/Si mixed member; 12: base material; 12a: chip-form base material; 14: filler; 16: SiC coating layer; 18: container.

The invention claimed is:

1. A method of producing a surface-treated mixed member of SiC and Si, the method comprising:
    a preparation step of preparing a Si member in a chip form or powdery form and a SiC member in a chip form or powdery form;
    a stirring step of placing, in a container, only the Si member and the SiC member prepared in the preparation step and mixing Si member and the SiC member each in a solid state in the container to prepare a mixed material of the Si member and the SiC member;
    a heating step of heating the mixed material of the Si member and the SiC member to a melting temperature of the Si member;
    a cooling step of recrystallizing the melted Si member with the SiC member being included in the melted Si member to prepare a mixed member of SiC and Si; and
    a surface treatment step of forming a SiC coating layer on a surface of the mixed member of SiC and Si after the cooling step.

2. The method according to claim 1, wherein in the heating step, the SiC member is dispersed in the Si member using convection of the Si member.

3. The method according to claim 1, wherein in the heating step, when melting the Si member, vibration is applied to perform degassing treatment.

\* \* \* \* \*